(12) United States Patent
Katkar et al.

(10) Patent No.: US 11,257,727 B2
(45) Date of Patent: Feb. 22, 2022

(54) SEAL FOR MICROELECTRONIC ASSEMBLY

(71) Applicant: INVENSAS BONDING TECHNOLOGIES, INC., San Jose, CA (US)

(72) Inventors: Rajesh Katkar, San Jose, CA (US); Liang Wang, Milpitas, CA (US); Cyprian Emeka Uzoh, San Jose, CA (US); Shaowu Huang, Sunnyvale, CA (US); Guilian Gao, San Jose, CA (US); Ilyas Mohammed, Santa Clara, CA (US)

(73) Assignee: INVENSAS BONDING TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/678,037

(22) Filed: Nov. 8, 2019

(65) Prior Publication Data
US 2020/0140267 A1 May 7, 2020

Related U.S. Application Data

(63) Continuation of application No. 15/920,759, filed on Mar. 14, 2018, now Pat. No. 10,508,030.
(Continued)

(51) Int. Cl.
*H01L 23/10* (2006.01)
*B81C 1/00* (2006.01)
(Continued)

(52) U.S. Cl.
CPC ............ *H01L 23/10* (2013.01); *B81B 7/0032* (2013.01); *B81B 7/0074* (2013.01);
(Continued)

(58) Field of Classification Search
CPC ....... H01L 23/02; H01L 23/04; H01L 23/053; H01L 23/10; B81C 1/00333;
(Continued)

(56) References Cited

U.S. PATENT DOCUMENTS 4,998,665 A 3/1991 Hayashi
5,087,585 A 2/1992 Hayashi
(Continued)

FOREIGN PATENT DOCUMENTS

CN 101554988 10/2009
EP 2813465 A1 12/2014
(Continued)

OTHER PUBLICATIONS

Daneman, "Applying the CMOS Test Flow to MEMS Manufacturing", InvenSense, Inc., accessed on Apr. 5, 2020.
(Continued)

*Primary Examiner* — Eduardo A Rodela
(74) *Attorney, Agent, or Firm* — Knobbe, Martens, Olson & Bear LLP

(57) ABSTRACT

Representative implementations of techniques and devices provide seals for sealing the joints of bonded microelectronic devices as well as bonded and sealed microelectronic assemblies. Seals are disposed at joined surfaces of stacked dies and wafers to seal the joined surfaces. The seals may be disposed at an exterior periphery of the bonded microelectronic devices or disposed within the periphery using the various techniques.

20 Claims, 13 Drawing Sheets

Related U.S. Application Data

(60) Provisional application No. 62/474,478, filed on Mar. 21, 2017.

(51) Int. Cl.
  B81B 7/00 (2006.01)
  H01L 23/04 (2006.01)
  H01L 23/053 (2006.01)
  H01L 23/02 (2006.01)

(52) U.S. Cl.
  CPC ...... B81C 1/00261 (2013.01); B81C 1/00269 (2013.01); B81C 1/00333 (2013.01); H01L 23/02 (2013.01); H01L 23/04 (2013.01); H01L 23/053 (2013.01); B81C 2203/038 (2013.01)

(58) Field of Classification Search
  CPC ............ B81C 1/00261; B81C 1/00269; B81C 2203/038; B81B 7/0032; B81B 7/0074
  See application file for complete search history.

(56) References Cited

U.S. PATENT DOCUMENTS

| | | | |
|---|---|---|---|
| 5,322,593 A | 6/1994 | Hasegawa et al. | |
| 5,753,536 A | 5/1998 | Sugiyama et al. | |
| 5,771,555 A | 6/1998 | Eda et al. | |
| 5,985,739 A | 11/1999 | Plettner et al. | |
| 5,998,808 A | 12/1999 | Matsushita | |
| 6,008,126 A | 12/1999 | Leedy | |
| 6,080,640 A | 6/2000 | Gardner et al. | |
| 6,265,775 B1 | 7/2001 | Seyyedy | |
| 6,374,770 B1 | 4/2002 | Lee | |
| 6,423,640 B1 | 7/2002 | Lee et al. | |
| 6,465,892 B1 | 10/2002 | Suga | |
| 6,777,263 B1 * | 8/2004 | Gan ............... B81C 1/00269 257/417 |
| 6,872,984 B1 | 3/2005 | Leung | |
| 6,876,062 B2 | 4/2005 | Lee et al. | |
| 6,887,769 B2 | 5/2005 | Kellar et al. | |
| 6,908,027 B2 | 6/2005 | Tolchinsky et al. | |
| 6,998,712 B2 | 2/2006 | Okada et al. | |
| 7,045,453 B2 | 5/2006 | Canaperi et al. | |
| 7,057,274 B2 | 6/2006 | Heschel | |
| 7,078,811 B2 | 7/2006 | Suga | |
| 7,105,980 B2 | 9/2006 | Abbott et al. | |
| 7,193,423 B1 | 3/2007 | Dalton et al. | |
| 7,354,798 B2 | 4/2008 | Pogge et al. | |
| 7,359,591 B2 | 4/2008 | Vandentop et al. | |
| 7,467,897 B2 | 12/2008 | Hauffe et al. | |
| 7,622,324 B2 | 11/2009 | Enquist et al. | |
| 7,750,488 B2 | 7/2010 | Patti et al. | |
| 7,803,693 B2 | 9/2010 | Trezza | |
| 7,972,683 B2 | 7/2011 | Gudeman et al. | |
| 8,183,127 B2 | 5/2012 | Patti et al. | |
| 8,191,756 B2 | 6/2012 | Coppeta et al. | |
| 8,241,961 B2 | 8/2012 | Kim et al. | |
| 8,269,671 B2 | 9/2012 | Chen et al. | |
| 8,314,007 B2 | 11/2012 | Vaufredaz | |
| 8,349,635 B1 | 1/2013 | Gan et al. | |
| 8,357,931 B2 | 1/2013 | Schieck et al. | |
| 8,377,798 B2 | 2/2013 | Peng et al. | |
| 8,395,229 B2 | 3/2013 | Garcia-Blanco et al. | |
| 8,411,444 B2 | 4/2013 | Gaynes et al. | |
| 8,441,131 B2 | 5/2013 | Ryan | |
| 8,476,146 B2 | 7/2013 | Chen et al. | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,530,997 B1 | 9/2013 | Yang et al. | |
| 8,546,928 B2 | 10/2013 | Merz et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 8,916,448 B2 | 12/2014 | Cheng et al. | |
| 8,988,299 B2 | 3/2015 | Kam et al. | |
| 9,093,350 B2 | 7/2015 | Endo et al. | |
| 9,142,517 B2 | 9/2015 | Liu | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,337,235 B2 | 5/2016 | Chen et al. | |
| 9,368,866 B2 | 6/2016 | Yu | |
| 9,385,024 B2 | 7/2016 | Tong et al. | |
| 9,386,688 B2 | 7/2016 | MacDonald et al. | |
| 9,391,143 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,464 B2 | 4/2017 | Baks et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,768,307 B2 | 9/2017 | Yamazaki et al. | |
| 9,799,587 B2 | 10/2017 | Fujii et al. | |
| 9,834,435 B1 * | 12/2017 | Liu ................... B81C 1/00269 |
| 9,852,988 B2 | 12/2017 | Enquist et al. | |
| 9,881,882 B2 | 1/2018 | Hsu et al. | |
| 9,893,004 B2 | 2/2018 | Yazdani | |
| 9,899,442 B2 | 2/2018 | Katka | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,727,219 B2 | 7/2020 | Uzoh et al. | |
| 10,784,191 B2 | 9/2020 | Huang et al. | |
| 10,923,408 B2 | 2/2021 | Huang et al. | |
| 11,004,757 B2 | 5/2021 | Katkar et al. | |
| 2002/0000328 A1 | 1/2002 | Motomura et al. | |
| 2002/0003307 A1 | 1/2002 | Suga | |
| 2002/0094608 A1 | 7/2002 | Brooks | |
| 2002/0179921 A1 | 12/2002 | Cohn | |
| 2003/0098060 A1 | 5/2003 | Yoshimi | |
| 2004/0084414 A1 | 5/2004 | Sakai et al. | |
| 2004/0259325 A1 | 12/2004 | Gan | |
| 2005/0009246 A1 | 1/2005 | Enquist et al. | |
| 2006/0001123 A1 | 1/2006 | Heck et al. | |
| 2006/0057945 A1 | 3/2006 | Hsu et al. | |
| 2006/0097335 A1 | 5/2006 | Kim et al. | |
| 2006/0115323 A1 | 6/2006 | Coppeta et al. | |
| 2006/0197215 A1 | 9/2006 | Potter | |
| 2006/0208326 A1 | 9/2006 | Nasiri et al. | |
| 2007/0029562 A1 | 2/2007 | Koizumi | |
| 2007/0045781 A1 | 3/2007 | Carlson et al. | |
| 2007/0045795 A1 | 3/2007 | McBean | |

(56) References Cited

U.S. PATENT DOCUMENTS

| | | |
|---|---|---|
| 2007/0096294 A1 | 5/2007 | Ikeda et al. |
| 2007/0111386 A1 | 5/2007 | Kim et al. |
| 2007/0134891 A1 | 6/2007 | Adetutu et al. |
| 2007/0188054 A1 | 8/2007 | Hasken et al. |
| 2007/0222048 A1 | 9/2007 | Huang |
| 2007/0295456 A1* | 12/2007 | Gudeman .............. H01B 1/026 |
| | | 156/379.7 |
| 2008/0080832 A1 | 4/2008 | Chen et al. |
| 2008/0124835 A1 | 5/2008 | Chen et al. |
| 2008/0290490 A1 | 11/2008 | Fujii et al. |
| 2008/0296709 A1 | 12/2008 | Haba et al. |
| 2009/0053855 A1 | 2/2009 | Summers |
| 2009/0186446 A1 | 7/2009 | Kwon et al. |
| 2010/0078786 A1 | 4/2010 | Maeda |
| 2010/0096713 A1 | 4/2010 | Jung |
| 2010/0148341 A1 | 6/2010 | Fuji et al. |
| 2010/0288525 A1 | 11/2010 | Basavanhally et al. |
| 2010/0301432 A1 | 12/2010 | Kittilsland et al. |
| 2011/0115092 A1 | 5/2011 | Tago |
| 2011/0147859 A1 | 6/2011 | Tanaka et al. |
| 2011/0156242 A1* | 6/2011 | Sakaguchi .......... B81C 1/00301 |
| | | 257/698 |
| 2011/0290552 A1 | 12/2011 | Palmateer et al. |
| 2012/0061776 A1 | 3/2012 | Cheng et al. |
| 2012/0097733 A1 | 4/2012 | Ebefors et al. |
| 2012/0100657 A1 | 4/2012 | Di Cioccio et al. |
| 2012/0112335 A1 | 5/2012 | Ebefors et al. |
| 2012/0142144 A1 | 6/2012 | Taheri |
| 2012/0212384 A1 | 8/2012 | Kam et al. |
| 2012/0267730 A1* | 10/2012 | Renard ................. B81B 7/0064 |
| | | 257/415 |
| 2012/0286380 A1 | 11/2012 | Yazdi et al. |
| 2012/0326248 A1 | 12/2012 | Daneman et al. |
| 2013/0043510 A1* | 2/2013 | Shu .................... B81C 1/00269 |
| | | 257/254 |
| 2013/0099331 A1 | 4/2013 | Chen et al. |
| 2013/0187245 A1 | 7/2013 | Chien et al. |
| 2013/0271066 A1 | 10/2013 | Signorelli et al. |
| 2013/0277774 A1 | 10/2013 | Frey et al. |
| 2013/0277777 A1 | 10/2013 | Chang et al. |
| 2013/0293428 A1 | 11/2013 | Souriau et al. |
| 2014/0175655 A1 | 6/2014 | Chen et al. |
| 2014/0217557 A1 | 8/2014 | Chen et al. |
| 2014/0225206 A1 | 8/2014 | Lin et al. |
| 2014/0225795 A1 | 8/2014 | Yu |
| 2014/0264653 A1 | 9/2014 | Cheng et al. |
| 2014/0361413 A1 | 12/2014 | Chapelon |
| 2015/0001632 A1 | 1/2015 | Liu et al. |
| 2015/0064498 A1 | 3/2015 | Tong |
| 2015/0068666 A1 | 3/2015 | Abe et al. |
| 2015/0091153 A1* | 4/2015 | Liu .................... B81C 1/00293 |
| | | 257/704 |
| 2015/0097215 A1 | 4/2015 | Chu et al. |
| 2015/0137345 A1 | 5/2015 | Choi et al. |
| 2015/0298965 A1 | 10/2015 | Tsai et al. |
| 2015/0336790 A1 | 11/2015 | Geen et al. |
| 2015/0336792 A1 | 11/2015 | Huang et al. |
| 2016/0002029 A1 | 1/2016 | Nasiri et al. |
| 2016/0107881 A1 | 4/2016 | Thompson et al. |
| 2016/0137492 A1 | 5/2016 | Cheng et al. |
| 2016/0229685 A1 | 8/2016 | Boysel |
| 2016/0240495 A1 | 8/2016 | Lachner et al. |
| 2016/0318757 A1 | 11/2016 | Chou et al. |
| 2016/0343682 A1 | 11/2016 | Kawasaki |
| 2017/0008757 A1 | 1/2017 | Cheng et al. |
| 2017/0062366 A1 | 3/2017 | Enquist |
| 2017/0081181 A1* | 3/2017 | Zhang ................. B81C 1/00333 |
| 2017/0137281 A1 | 5/2017 | Favier et al. |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0225947 A1* | 8/2017 | Chen ..................... H01L 25/50 |
| 2017/0271222 A1* | 9/2017 | Kang .................. H01L 21/4817 |
| 2017/0305738 A1 | 10/2017 | Chang et al. |
| 2017/0338214 A1 | 11/2017 | Uzoh et al. |
| 2018/0044175 A1 | 2/2018 | Ogashiwa et al. |
| 2018/0047682 A1 | 2/2018 | Chang et al. |
| 2018/0096931 A1 | 4/2018 | Huang et al. |
| 2018/0148327 A1* | 5/2018 | Chang ................. B81C 1/00269 |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1* | 8/2018 | Gambino .......... H01L 27/14618 |
| 2018/0226375 A1 | 8/2018 | Enquist et al. |
| 2018/0269161 A1 | 9/2018 | Wu et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0337157 A1 | 11/2018 | Wang et al. |
| 2019/0051628 A1 | 2/2019 | Liu et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0144269 A1* | 5/2019 | Rajasekaran ......... B81B 7/0077 |
| | | 257/704 |
| 2019/0164914 A1 | 5/2019 | Hu et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0043817 A1 | 2/2020 | Shen et al. |
| 2020/0075534 A1 | 3/2020 | Gao et al. |
| 2020/0118973 A1 | 4/2020 | Wang et al. |
| 2020/0126906 A1 | 4/2020 | Uzoh et al. |
| 2020/0131028 A1 | 4/2020 | Cheng et al. |
| 2020/0140268 A1 | 5/2020 | Katkar et al. |
| 2020/0144217 A1 | 5/2020 | Enquist et al. |
| 2020/0194396 A1 | 6/2020 | Uzoh |
| 2020/0227367 A1 | 7/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0371154 A1 | 11/2020 | DeLaCruz et al. |
| 2020/0395321 A1 | 12/2020 | Katkar et al. |
| 2021/0098412 A1 | 4/2021 | Haba et al. |
| 2021/0134689 A1 | 5/2021 | Huang et al. |
| 2021/0181510 A1 | 6/2021 | Katkar et al. |
| 2021/0193603 A1 | 6/2021 | Katkar et al. |
| 2021/0193625 A1 | 6/2021 | DeLaCruz et al. |
| 2021/0202428 A1 | 7/2021 | Wang et al. |
| 2021/0242152 A1 | 8/2021 | Fountain, Jr. et al. |
| 2021/0265227 A1 | 8/2021 | Katkar et al. |

FOREIGN PATENT DOCUMENTS

| | | |
|---|---|---|
| JP | 2000-100679 | 4/2000 |
| JP | 2001-102479 | 4/2001 |
| JP | 2001-148436 | 5/2001 |
| JP | 2002-353416 | 12/2002 |
| JP | 2009-238905 | 10/2009 |
| JP | 2010-199608 | 9/2010 |
| JP | 2013-33786 | 2/2013 |
| JP | 2018-160519 | 10/2018 |
| KR | 10-2005-0101324 | 10/2005 |
| KR | 10-2015-0097798 | 8/2015 |
| KR | 10-2017-0108143 | 9/2017 |
| WO | WO 2005/043584 A2 | 5/2005 |
| WO | WO 2006/100444 A1 | 9/2006 |
| WO | WO 2014-074403 A1 | 5/2014 |

(56) References Cited

FOREIGN PATENT DOCUMENTS

WO  WO 2017/100256 A1  6/2017
WO  WO 2017/151442 A1  9/2017

OTHER PUBLICATIONS

Inertial MEMS Manufacturing Trends 2014 Report by Yole Developpement Sample Report, Slide 11, https://www.slideshare.net/Yole_Developpement/yole-inertial-memsmanufacturingtrends2014sample.
"The Advantages of Integrated MEMS to Enable the Internet of Moving Things", mCube, White Paper Jan. 2018.
International Search Report and Written Opinion dated May 31, 2018 in International Application No. PCT/US2018/022688, 14 pages.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(I), 6 pages.
Plobi, A. et al., "Wafer direct bonding: tailoring adhesion between brittle materials," Materials Science and Engineering Review Journal, 1999, R25, 88 pages.
Amirfeiz et al., "Formation of silicon structures by plasma-activated wafer bonding," Journal of The Electrochemical Society, 2000, vol. 147, No. 7, pp. 2693-2698.
Beer et al., "Coplanar 122GHz Antenna Array With Air Cavity Reflector for Integration in Plastic Packages", IEEE Antennas and Wireless Propagation Letters, 11:160-163, Jan. 2012.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Gösele et al., "Semiconductor Wafer Bonding: A flexible approach to materials combinations in microelectronics; micromechanics and optoelectronics," IEEE, 1997, pp. 23-32.
Gu et al., "A Multilayer Organic Package with 64 Dual-Polarized Antennas for 28GHz 5G Communication", IBM Research, pp. 1-3, 2017.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.

Howlader et al., "Characterization of the bonding strength and interface current of p-Si/ n-lnP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion dated Apr. 13, 2018 in International Application No. PCT/US2017/067742, 14 pages.
International Search Report and Written Opinion dated Apr. 16, 2018 in International Application No. PCT/US2017/067741, 17 pages.
International Search Report and Written Opinion dated Mar. 7, 2019, in International Application No. PCT/US2018/060044, 14 pages.
International Search Report and Written Opinion dated Apr. 22, 2019 in International Application No. PCT/US2018/064982, 13 pages.
International Search Report and Written Opinion dated Aug. 26, 2019 in International Application No. PCT/US2019/031113, 14 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electornic Components and Technology Confererence, 2001, 51st Proceedings, IEEE, pp. 384-387.
Norton, Francis, "Permeation of gases through solids," Journal of Applied Physics, Janaury 1957, vol. 28, No. 1.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.

(56) References Cited

OTHER PUBLICATIONS

Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding, IEMT/IMC Symposium, 1997, Joint International Electronic Manufacturing Symposium and the International Microelectronics Conference," Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding, Journal of Microelectomechanical systems," Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Zhang et al., "Antenna-on-Chip and Antenna-in-Package Solutions to Highly Integrated Millimeter-Wave Devices for Wireless Communications", IEEE Transactions on Antennas and Propagation, 57(10):2830-2841, Oct. 2009.
Zhou et al., "A Wideband Circularly Polarized Patch Antenna for 60 GHz Wireless Communications", Wireless Engineering and Technology, 3:97-105, 2012.
Zoschke, K. et al., "Hermetic wafer level packaging of MEMS components using through silicon via and wafer to wafer bonding technologies," 2013 Electronic Components & Technology Conference, 2013 IEEE, pp. 1500-1507.
Ceramic Microstructures: Control at the Atomic Level, Recent Progress in Surface Activated Bonding, 1998, pp. 385-389.
Taiwan Office Action dated Apr. 20, 2021, Taiwan Application No. 107109294, 5 pages.

* cited by examiner

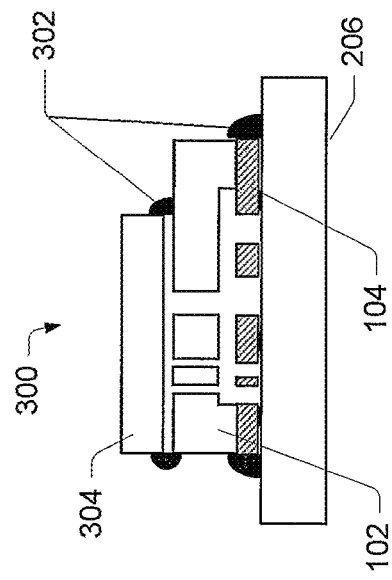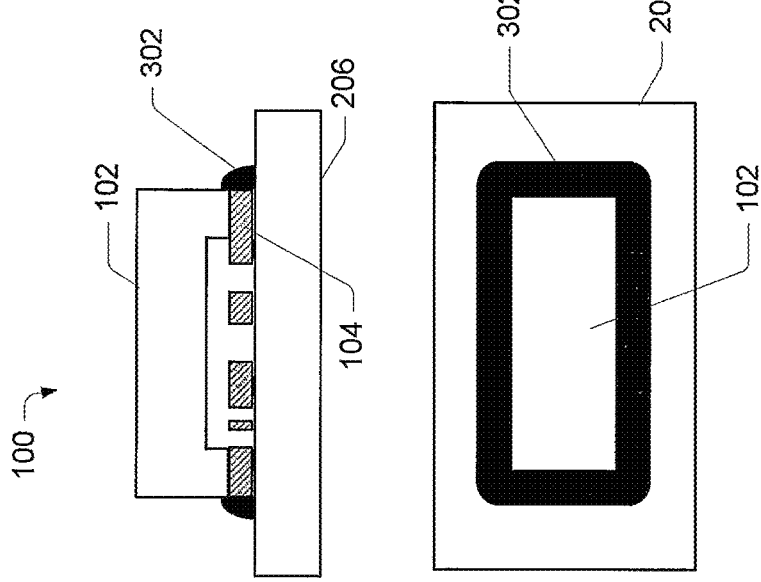

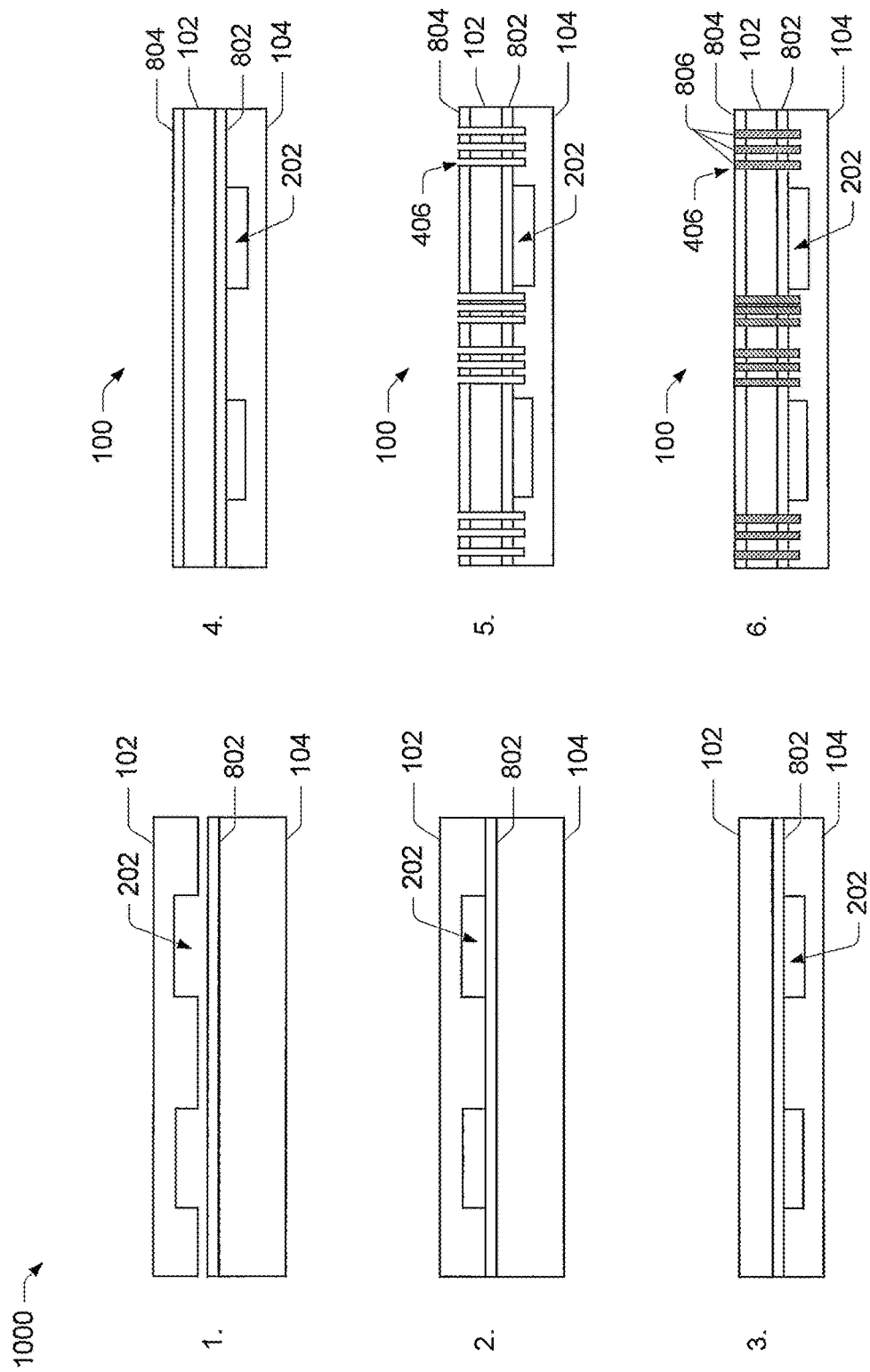

SEAL FOR MICROELECTRONIC ASSEMBLY

PRIORITY CLAIM AND CROSS-REFERENCE TO RELATED APPLICATION

This application is a continuation of U.S. patent application Ser. No. 15/920,759, filed Mar. 14, 2018, which claims the benefit under 35 U.S.C. § 119(e)(1) of U.S. Provisional Application No. 62/474,478, filed Mar. 21, 2017, which is hereby incorporated by reference in its entirety.

FIELD

The following description relates to processing of integrated circuits ("ICs"). More particularly, the following description relates to devices and techniques for processing IC dies and assemblies.

BACKGROUND

The demand for more compact physical arrangements of microelectronic elements such as integrated chips and dies has become even more intense with the rapid progress of portable electronic devices, the expansion of the Internet of Things, nano-scale integration, subwavelength optical integration, and more. Merely by way of example, devices commonly referred to as "smart phones" integrate the functions of a cellular telephone with powerful data processors, memory and ancillary devices such as global positioning system receivers, electronic cameras, a variety of sensors, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips and dies into a small space.

Microelectronic elements often comprise a thin slab of a semiconductor material, such as silicon or gallium arsenide. Chips and dies are commonly provided as individual, pre-packaged units. In some unit designs, the die is mounted to a substrate or a chip carrier, which is in turn mounted on a circuit panel, such as a printed circuit board (PCB). Dies can be provided in packages that facilitate handling of the die during manufacture and during mounting of the die on the external substrate. For example, many dies are provided in packages suitable for surface mounting.

Numerous packages of this general type have been proposed for various applications. Most commonly, such packages include a dielectric element, commonly referred to as a "chip carrier" with terminals formed as plated or etched metallic structures on the dielectric. The terminals typically are connected to the contacts (e.g., bond pads) of the die by conductive features such as thin traces extending along the die carrier and by fine leads or wires extending between the contacts of the die and the terminals or traces. In a surface mounting operation, the package may be placed onto a circuit board so that each terminal on the package is aligned with a corresponding contact pad on the circuit board. Solder or other bonding material is generally provided between the terminals and the contact pads. The package can be permanently bonded in place by heating the assembly so as to melt or "reflow" the solder or otherwise activate the bonding material.

Many packages include solder masses in the form of solder balls that are typically between about 0.02 mm and about 0.8 mm (5 and 30 mils) in diameter, and are attached to the terminals of the package. A package having an array of solder balls projecting from its bottom surface (e.g., surface opposite the front face of the die) is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This scale is advantageous in that it reduces the overall size of the assembly and permits the use of short interconnections between various devices on the substrate, which in turn limits signal propagation time between devices and thus facilitates operation of the assembly at high speeds.

Semiconductor dies can also be provided in "stacked" arrangements, wherein one die is provided on a carrier, for example, and another die is mounted on top of the first die. These arrangements can allow a number of different dies to be mounted within a single footprint on a circuit board and can further facilitate high-speed operation by providing a short interconnection between the dies. Often, this interconnect distance can be only slightly longer than the thickness of the die itself. For interconnection to be achieved within a stack of die packages, interconnection structures for mechanical and electrical connection may be provided on both sides (e.g., surfaces) of each die package (except, perhaps, for the topmost package). This has been done, for example, by providing contact pads or lands on both sides of the substrate to which the die is mounted, the pads being connected through the substrate by conductive vias or the like. Examples of stacked chip arrangements and interconnect structures are provided in U.S. Patent App. Pub. No. 2010/0232129, the disclosure of which is incorporated by reference herein. In other examples, Through Silicon Vias (TSVs) are used for interconnection to be achieved within a stack of die packages. In some cases, dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company (see for example, U.S. Pat. Nos. 6,864,585 and 7,485,968, which are incorporated herein in their entirety).

Stacked die and wafer arrangements, including bonded arrangements, may also be used to form assembled components such as microelectromechanical systems (MEMS), sensors, and the like. See, for example, U.S. Pat. No. 7,109,092, which is incorporated herein in its entirety. In many of these arrangements, it is desirable for the stacked dies and wafers to be sealed at their joined surfaces, for instance, to form a sensor cavity. In some cases, making such seals reliable and long-lasting can be problematic, particularly at the chip scale.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

FIG. 3A shows a plan view of an example sealed microelectronic device, according to an embodiment. FIG. 3B shows a top view of the example sealed microelectronic device, according to the embodiment. FIG. 3C shows a sealed multi-stack microelectronic arrangement.

FIG. 10 is a graphical flow diagram illustrating an example processing sequence to form a sealed microelectronic device, according to a further embodiment.

DETAILED DESCRIPTION

Overview

Figure 1:
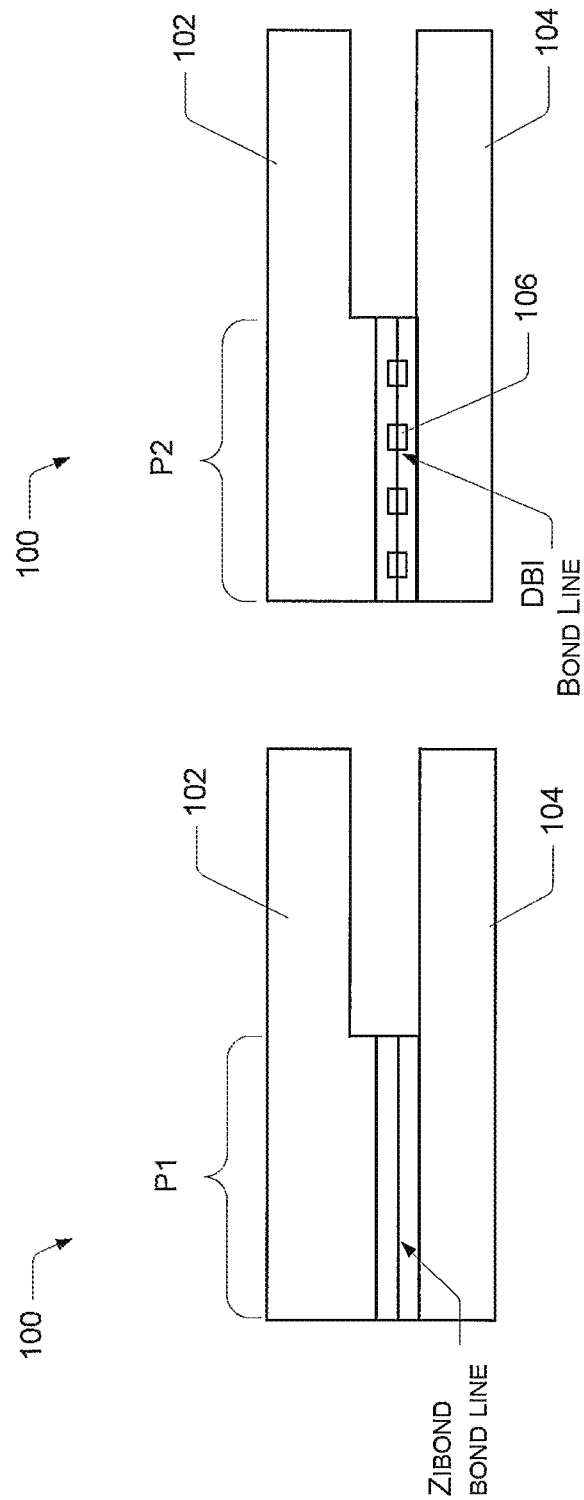
FIG. 1A shows a cavity wafer bonded to a MEMS wafer using a Zibond technique.
FIG. 1B shows a cavity wafer bonded to a MEMS wafer using a Zibond technique with a DBI technique.

Various embodiments of techniques and devices for forming seals and sealed microelectronic devices are disclosed. Seals are disposed at joined (e.g., bonded, coupled, etc.) surfaces of stacked dies and wafers to seal (e.g., hermetically seal) the joined surfaces. The joined surfaces may be sealed to form sensor cavities, or the like, as part of the microelectronic devices. For instance, when a die with a recessed surface is bonded to another die with a flat surface or a recessed surface, a cavity can be formed between the two dies. In some applications, it may be desirable for this cavity to be hermetically sealed, to maintain a specific vacuum level inside the cavity and for predetermined leak rates to be maintained.

The leak rate of a sealed cavity can be looked at as a function of the cavity's volume. For example, if the volume of a cavity is less than or equal to 0.01 cc, generally, the leak rate is to be below 5E-8 atm-cc/s of air to consider the cavity hermetically sealed. If the volume of the cavity ranges between 0.01 and 0.4 cc, the leak rate is to be below 1E-7, and if the volume is greater than 0.4 cc, then the leak rate is to be below 1E-6 for a hermetically sealed cavity (per MIL-STD-883 Method 1014, MIL-STD-750 Method 1071).

The integrity of a seal at the periphery of a stack of dies can be critical to maintain the application specific hermeticity and low leak rates of the package. Metals, ceramics, and glasses are the typical materials used to form the seal and to prevent water vapor or other gases (e.g. oxygen, etc.) from accessing components inside the package. A properly made hermetic seal with a sufficiently low leak rate can keep the interior of a package dry and moisture free for many years.

The techniques disclosed herein include forming seals of one or more metallic materials (for example) at a joint (e.g., a bond line, a seam, etc.) of at least two surfaces, which seals the joined surfaces at the joint. In various implementations, metallic materials may be deposited using electroless plating, or the like. In some embodiments, metallic materials may be deposited directly onto the joined surfaces at or around the joint. In other embodiments, one or more non-metallic materials may be deposited onto the joined surfaces, and metallic material can be deposited over the non-metallic material(s), sealing the joint. The seal may include a continuous sealing ring formed completely around joined dies or wafers (e.g., a periphery of the devices) or one or more partial seals, as desired.

In various embodiments, the techniques disclosed can seal dies and wafers that are stacked and bonded using "ZIBOND®" techniques, which can benefit from the added seal. For example, at FIG. 1A, a cavity wafer 102 is bonded to a microelectromechanical system (MEMS) wafer 104 (or any other wafer) using a ZIBOND® technique, for example, to form a microelectronic device 100 such as a MEMS sensor device. A cavity wafer 102 (or a die) may have 1 or more cavities or recesses of the same or varying size. Especially-flat surfaces of the two wafers (102 and 104) are bonded together using a low temperature covalent bond between the two corresponding semiconductor and/or insulator layers. While the bond may be good, the seal may not be adequate as a hermetic seal, and the leak rates may not be as low as desired for the application. Further, the bond line width (P1) may not be optimal, since a relatively long bond line can unnecessarily increase the die size and can reduce the number of dies fabricated per wafer.

In another example, as shown at FIG. 1B, the seal may be improved by forming one or more metal-to-metal interconnections along the bonding seam using a Direct Bond Interconnect (DBI®) technique. Metallic lines 106 are deposited along each of the surfaces to be joined, so as to be aligned to each other, and form metal-to-metal bonds when set together using temperature and/or pressure. In some cases, the DBI lines 106 can help to reduce the bond line width (P2) while improving the hermeticity of the joint. However, the bond line width (P1) needed for utilizing a ZiBond method may not be adequate for the application (e.g., a 100 micron bond line width using Zibond may be reduced to tens of microns or less than 10 microns, using DBI for example). Further, such DBI bonds are not easy to achieve, potentially adding to the complexity and cost of the assembly.

Figure 2:
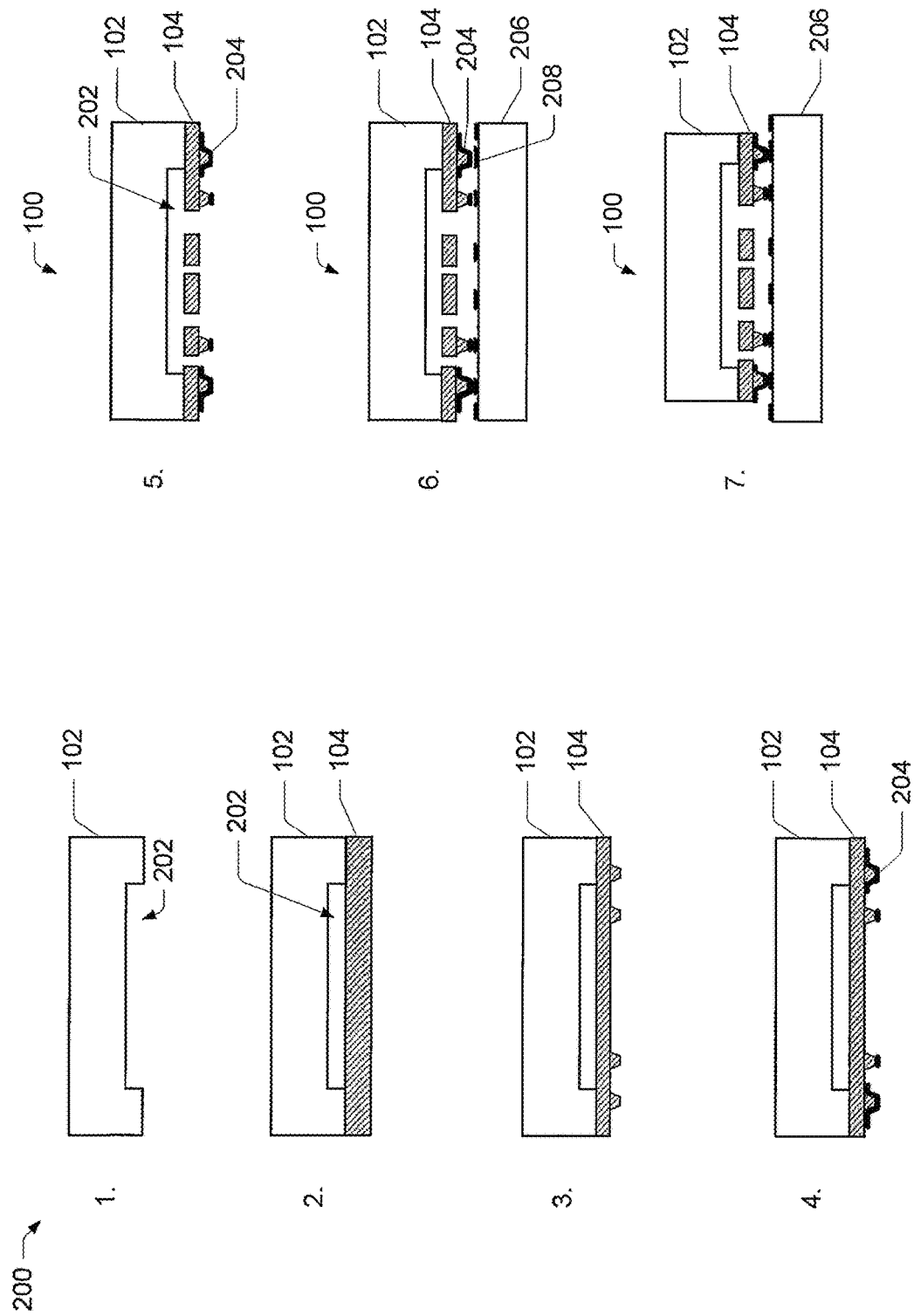
FIG. 2 is a graphical flow diagram illustrating an example processing sequence to form a stacked microelectronic device.

FIG. 2 is a graphical flow diagram illustrating an example processing sequence 200 to form a stacked microelectronic device 100. The process 200 and the stacked microelectronic device 100 form a background for discussing various sealing techniques and devices. In various embodiments, the process 200 described with reference to FIG. 2 may be modified to include the techniques and devices for hermetically sealing bonded components at the bond joints. FIG. 2 describes the process for a 3 die stack creating a hermetically sealed cavity 202 between top (and middle) and (middle and) bottom die. But a stack could also include only 2 dies with a cavity 202 between them, as depicted in FIG. 1.

At block 1, a recessed cavity wafer 102 is formed. Although one cavity 202 is shown in the illustration at block 1, one or more cavities 202 of similar or different dimensions may be formed per die location, effectively forming several such recessed cavities 202 on a wafer (or die) 102. At block 2, the cavity wafer 102 is bonded to a MEMS wafer 104 (or any other wafer or die) closing the cavity 202 within. The cavity wafer 102 can be bonded to the MEMS wafer 104 using an intimate surface bonding technique, for example, a ZIBOND® technique, wherein insulating surfaces (e.g., SiOx-SiOx, etc.) are bonded. At block 3, the MEMS wafer 104 may be thinned and patterned to form stand-offs. At block 4, metallization 204 can be added to the patterned surface of the MEMS wafer 104, including pads, contacts, traces, and so forth. In an alternate example, no metallization 204 is added to the surface of the MEMS wafer 104. In the example, the microelectronic device 100 can be attached to another device, such as a logic device wafer, for example, using a Zibond technique (e.g., SiOx-SiOx bond) or the like at the bonded surfaces, or using other bonding techniques for dielectrics (such as a polymeric material, e.g. die attached film or paste) on one or both bonded surfaces.

At block 5, openings are formed in the MEMS wafer 104, accessing the cavity 202, to define the characteristics of the microelectronic device 100, based on the application. At block 6, the microelectronic device 100 can be attached to a logic device wafer (or die) 206, to provide logic/control (for example) for the microelectronic device 100. Metallization layer 204 contact pads of the microelectronic device 100 are coupled to contacts 208 on the surface of the logic device 206. At block 7, portions of the microelectronic device 100 (such as portions of the cavity wafer 102) are removed (e.g., etched, etc.) to provide access to other contact pads of the logic device wafer 206, and so forth. In some instances, the Zibond or DBI interface between the cavity wafer 102 and the MEMS wafer 104 may provide an adequate resistance to the flow of fluids, such as gases and/or liquids. In other embodiments, one or more of the bond lines or coupling joints of the microelectronic device 100 can be sealed for hermeticity (e.g., a predetermined resistance to the flow of fluids, such as gases and/or liquids, and sufficiently low moisture vapor transmission rate, oxygen transmission rate, etc.), as discussed below.

EXAMPLE EMBODIMENTS

To ensure a strong and hermetically sealed bond, the techniques disclosed herein include bonding insulator surfaces of the wafers (e.g., 102 and 104), then adding a metallic seal at the bond line to improve the hermeticity, as discussed further below.

FIG. 3 shows example embodiments of sealing a microelectronic device 100, such as the microelectronic device 100 formed with reference to FIG. 2. As shown by the side view of the microelectronic device 100 at FIG. 3A and the top view at FIG. 3B, a metallic seal ring 302 can be formed surrounding the bonded joint of the cavity wafer 102 and the MEMS wafer 104, and can also be extended to seal the logic device 206 to the MEMS wafer 104. The seal ring 302 creates a hermetic seal around a periphery of the microelectronic components (e.g., 102, 104, and 206), fully sealing the joints between the components. The seal ring 302 can be located to seal any or all of the joints between the microelectronic components (e.g., 102, 104, and 206), as desired.

In various embodiments, the seal ring 302 is comprised of a metallic material (i.e., a metal such as copper, for example, an alloy, or a metallic composition). In some embodiments, two or more metallic materials may be used in layers (or other combinations) to form the seal ring 302. In the various embodiments, the seal ring 302 is deposited using electroless plating, electro-deposition, mechanical printing, or various combinations thereof, or the like.

As shown at FIG. 3C, multiple seal rings 302 may be used to seal between multiple components (e.g., 102, 104, 206, and 304) at different stacking levels in a stacked microelectronic arrangement 300. Seal rings 302 may be used at any or all of the levels of the stacked arrangement 300, as desired. While complete seal rings 302 are discussed and illustrated, partial seal rings 302 may also be used where desired to form seals at bond joints or between components (e.g., 102, 104, 206, and 304) of a microelectronic device (e.g., 100, 300) or assembly.

Figure 4:
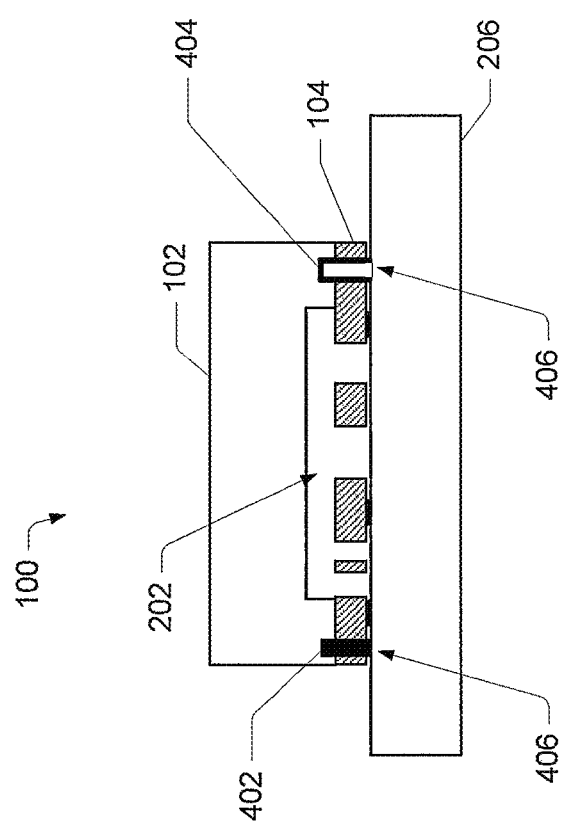
FIG. 4 shows an example sealed microelectronic device, according to another embodiment. Two separate configurations of example seals are illustrated in the example.

FIG. 4 shows an example sealed microelectronic device 100, according to another embodiment, using interior seals (e.g., 402 and 404). Alternately or in addition to the exterior seal rings 302 shown in FIG. 3, interior seals (e.g., 402 and 404) are formed after drilling, etching, or otherwise forming a channel 406 (fully or partially) around an inside perimeter of the bonded components (e.g., 102, 104, and 206). Two separate configurations of example seals are illustrated in FIG. 4, a filled seal 402 and a conformal seal 404. Both configurations are formed in channels 406, drilled portions, or the like, as discussed further below. The filled seal ring 402 mostly or fully fills the channel 406 or drilled cavity with one or more metallic materials to form the hermetic seal at the bond joint. The conformal seal ring 404 plates the walls of the channel 406 or cavity with the one or more metallic materials to form the hermetic seal. In various implementations, either the filled seal 404 or the conformal seal 406 may be used to hermetically seal two or more components (e.g., 102, 104, and 206), as desired. In various examples, multiple concentric seal rings (e.g., 302, 402, and 404) may be used to seal two (or more) components (e.g., 102, 104, and 206). The channel(s) 406 may extend through component 104 and to the interface with component 102 or, shown, into component 102.

Figure 5:
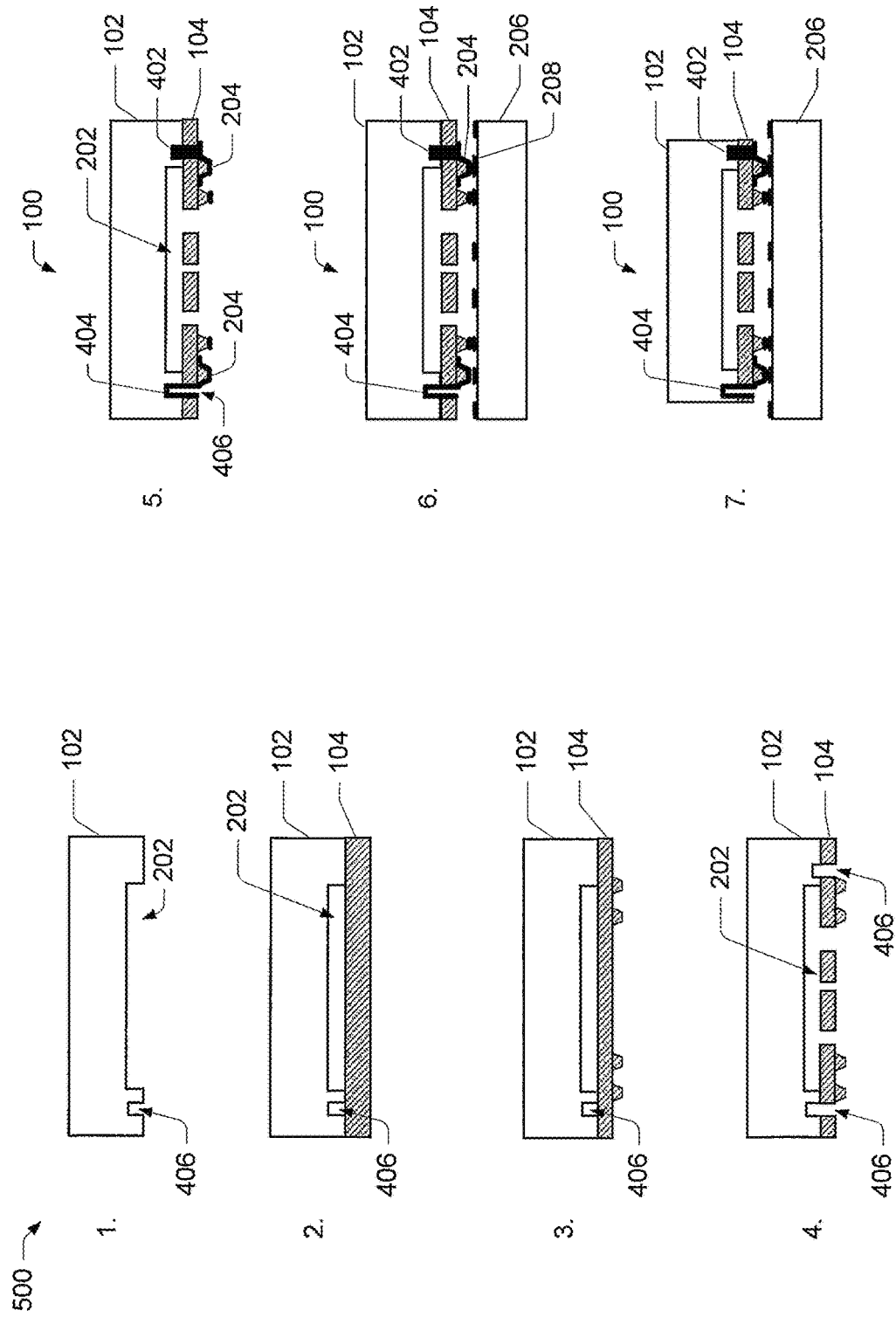
FIG. 5 is a graphical flow diagram illustrating an example processing sequence to form a sealed microelectronic device, according to an embodiment.

FIG. 5 is a graphical flow diagram illustrating an example processing sequence 500 to form a sealed microelectronic device 100, according to an embodiment using interior seals (e.g., 402 and 404). In various embodiments, the process 500 described with reference to FIG. 5 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed. A channel 406 (or "cavity ring," partly or fully surrounding the cavity 202) is formed on the cavity-side surface of the wafer 102. The channel 406 may be formed by etching, drilling, or otherwise removing material from the surface of the wafer 102.

At block 2, the cavity wafer 102 is bonded to a MEMS wafer 104 closing the cavity 202 within. The cavity wafer 102 can be bonded to the MEMS wafer 104 using an intimate surface bonding technique, for example, such as a ZIBOND® technique, wherein insulating surfaces (e.g., SiOx-SiOx, etc.) are bonded. In another example, the cavity wafer 102 can be bonded to the MEMS wafer 104 using another dielectric bonding technique (e.g. die attach film or paste, a polymeric material such as a silicone or epoxy, or the like, which may not provide a hermetic seal and may not improve or fix a hermetic seal).

At block 3, the MEMS wafer 104 may be thinned and patterned to form stand-offs. In another case, the stand-offs are optional and may not be formed on the MEMS wafer 104. In such a case, the standoffs can be formed on the logic wafer 206 or can be created by any other material (e.g. die attach film or paste, etc.). At block 4, openings are formed in the MEMS wafer 104, accessing the cavity 202, to define the characteristics of the microelectronic device 100, based on the application. Also, channels 406 are formed in the MEMS wafer 104 (and in the cavity wafer 102, in some examples) for forming interior seals (e.g., 402 and 404) to seal the bonding joint between the cavity wafer 102 and the MEMS wafer 104. In one case the MEMS wafer 104 can be drilled to open an area in the MEMS wafer 104 that is aligned with the cavity ring channel 406 previously formed in the cavity wafer 102. In an alternate case, the MEMS wafer 104 and the cavity wafer 102 can be drilled together to form the cavity ring channel 406 (e.g., the channel 406 in the cavity wafer 102 is formed at this step, while drilling the MEMS wafer 104, rather than being pre-formed prior to bonding the cavity wafer 102 to the MEMS wafer 104).

At block 5, metallization 204 is added to the patterned surface of the MEMS wafer 104, including pads, contacts, traces, and so forth. The cavity ring channel 406 can also be metallized at this time. The channel 406 can be partially or fully filled/plated to form a filled seal ring 402, or the walls of the channel 406 can be metallized/plated to form a conformal seal ring 404. Either the filled seal ring 402 or the conformal seal ring 404 (whichever is used) hermetically seal the bond joint between the cavity wafer 102 and the MEMS wafer 104.

In another example, after bonding, the MEMS wafer 104 and the cavity wafer 102 can be drilled together to form the cavity ring channel 406, which can be metallized and then the openings to the cavity 202 are formed in the MEMS wafer 104.

At block 6, the microelectronic device 100 may be attached to a logic device 206, to provide logic/control (for example) for the microelectronic device 100. Contact pads of the metallized layer 204 of the microelectronic device 100 can be coupled to contacts 208 on the surface of the logic device 206. At block 7, portions of the microelectronic device 100 may be removed (e.g., etched, etc.) to provide access to other contact pads of the logic device 206, and so forth.

Figure 6A:
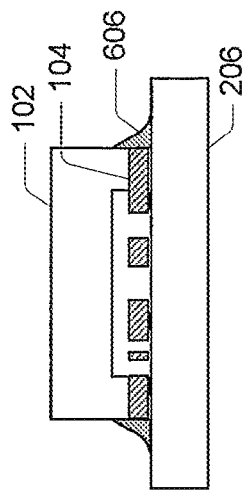
FIGS. 6A-6E illustrate example embodiments of seals and sealed microelectronic devices, according to various embodiments.

FIGS. 6A-6E illustrate example embodiments of seals 302, 402, and 404 and sealed microelectronic devices 100, according to various embodiments. A first embodiment, illustrated at FIG. 6A, shows exterior seals 302 implemented as discussed above with reference to FIGS. 3 and 4. Each seal 302 forms a bead that covers one or more bonding or coupling joints between the microelectronic components 102, 104, and 206, to hermetically seal the joints. The seals 302 can be comprised of a metallic material such as a metal, an alloy, or a metal composite, for example a combination of two or more metals, a metal-glass composite material, a metal-ceramic composite, or the like.

Figure 6B:
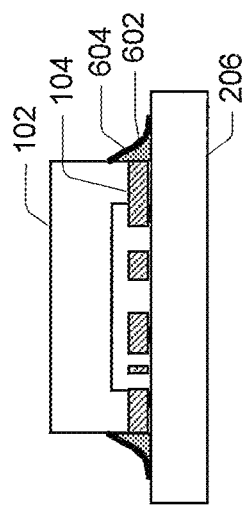

A second embodiment, illustrated at FIG. 6B, shows seals having a layered approach, where a polymer seal 602 is applied to the exterior of the joint first and a metallic material seal 604 is deposited over the polymer seal 602, forming a hermetic seal. In alternate implementations, multiple polymer materials forming one or more polymer seals 602 and/or multiple metallic layers forming one or more metallic seals 604 may also be used to form a seal ring.

Figure 6C:
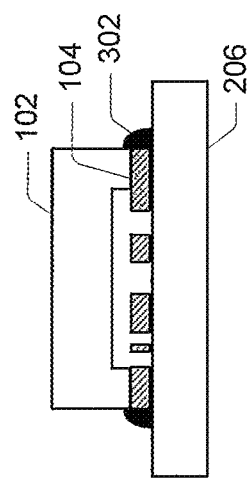

A third embodiment, illustrated at FIG. 6C, shows another exterior seal ring 606, comprised of a sinterable conductive paste, a fritted glass composite, or the like. The metallic or glass components in the deposited seal 606 material provide the hermetic seal desired.

Figure 6D:
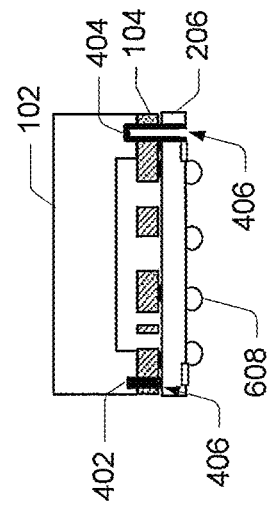

A fourth embodiment, illustrated at FIG. 6D, shows interior seals 402 and 404 as discussed above with reference to FIGS. 5 and 6. A channel 406 is formed through the MEMS wafer 104 and into the cavity wafer 102, and the channel 406 is plated from the MEMS wafer 104 side with metallic material, either fully (e.g., 402), partially (not shown) or conformal (e.g., 404) to the channel 406 walls.

Figure 6E:
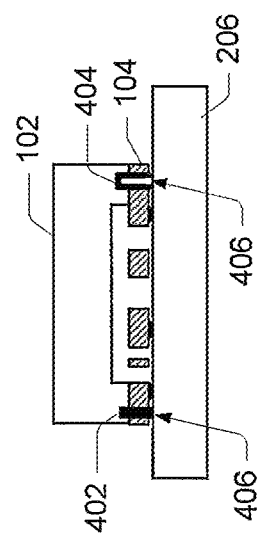

A fifth embodiment, illustrated at FIG. 6E, shows an example of forming a seal ring (e.g., 404) through multiple components (e.g., 102, 104, and 206). In this example, the logic wafer 206 (or the like) can be thinned and drilled through, similar to the MEMS wafer 104. For example, the logic wafer 206, MEMS wafer 104, and cavity wafer 102 may be bonded in a process and then drilled together, or in separate steps to be aligned. Plating or filling the drilled channel 406 from the logic wafer 206 side forms a seal ring (e.g., 404) that extends from the logic wafer 206, through the MEMS wafer 104, and into the cavity wafer 102, hermetically sealing each of the bonding joints and the spaces between the components (e.g., 102, 104, and 206). Alternately, the seal (e.g., 404) may extend through only some of the layers/components as desired. In various embodiments, the metallization of the seals (e.g., 402, 404) may be electrically continuous with or coupled to one or more device pads, for grounding, or the like (which may also be electrically continuous with a ball terminal 608 (for example) on the package. While multiple types of metallization (conformal, nonconformal) are shown in FIGS. 6D, 6E and elsewhere in this disclosure, only a single type of metallization may be used at a time to form a continuous or discontinuous shape for inhibiting fluid flow and, thus, improving hermeticity.

FIGS. 7A-7D illustrate example embodiments of seals 402 and 404 and sealed microelectronic devices 100, according to further embodiments. In one embodiment, illustrated at FIG. 7A, an embedded metallic ring 702 is partially or fully embedded within the cavity wafer 102 (and/or the MEMS wafer 104) and partially or fully surrounds the cavity 202. The embedded metallic ring 702, which may be disposed at or near the bond line, can aid in sealing the bond joint between the cavity wafer 102 and the MEMS wafer 104. A via (not shown for the sake of simplicity) may extend through cavity wafer 102 and contact the metallic ring 702. In another embodiment, illustrated at FIG. 7B, the microelectronic device 100 includes an embedded metallic ring 702 partially or fully surrounding the cavity 202, as well as one or more interior seals 402 and/or 404, as discussed above with reference to FIGS. 5 and 6. A channel 406 is formed through the MEMS wafer 104 and into the cavity wafer 102, to the embedded metallic ring 702, and the channel 406 is plated from the MEMS wafer 104 side with metallic material, either fully (e.g., 402), partially (not shown) or conformal (e.g., 404) to the channel 406 walls.

Figure 7A:
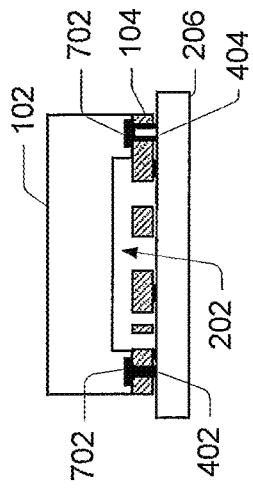
FIGS. 7A-7D illustrate example embodiments of seals and sealed microelectronic devices, according to further embodiments.
Figure 7B:
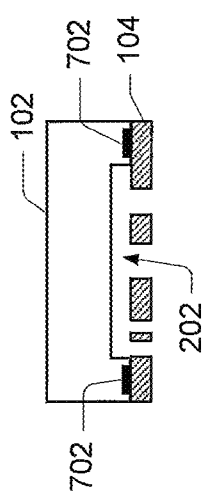
Figure 7C:
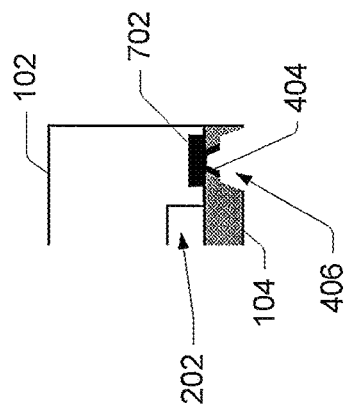
Figure 7D:
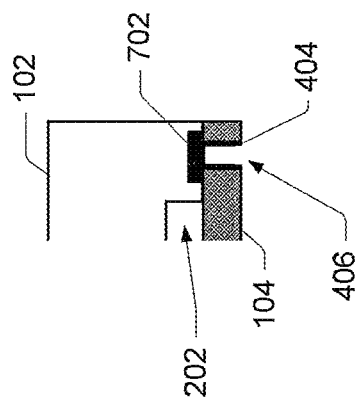

As shown in FIG. 7B, the interior seals 402 and/or 404 are landed on (e.g., are in contact with) the embedded metallic ring 702. FIGS. 7C and 7D show close detail views of two possible embodiments (of many) for this arrangement. For example, in FIG. 7C, the channel 406 has a relatively rectangular cross-section, and in FIG. 7D, the channel has a polygonal, or otherwise shaped cross-section (e.g., partially or fully elliptical, irregular, etc.). In various embodiments, the width of the cross-section of the channel 406 and the seal (402 and/or 404), where the seal (402 and/or 404) makes contact with the embedded metallic ring 702, is less (e.g., 60% or less) than the width of the cross-section of the embedded metallic ring 702. The metallic fill for the seals 404 may be fully (as seen in FIG. 7C) or partially (as seen in FIG. 7D) lining the interior walls of the channel 406, while making contact with (landed on) the embedded metallic ring 702. In various embodiments, the shape of the channel 406 may be predetermined, or may be a product of the drilling techniques employed to form the channel 406.

Figure 8:
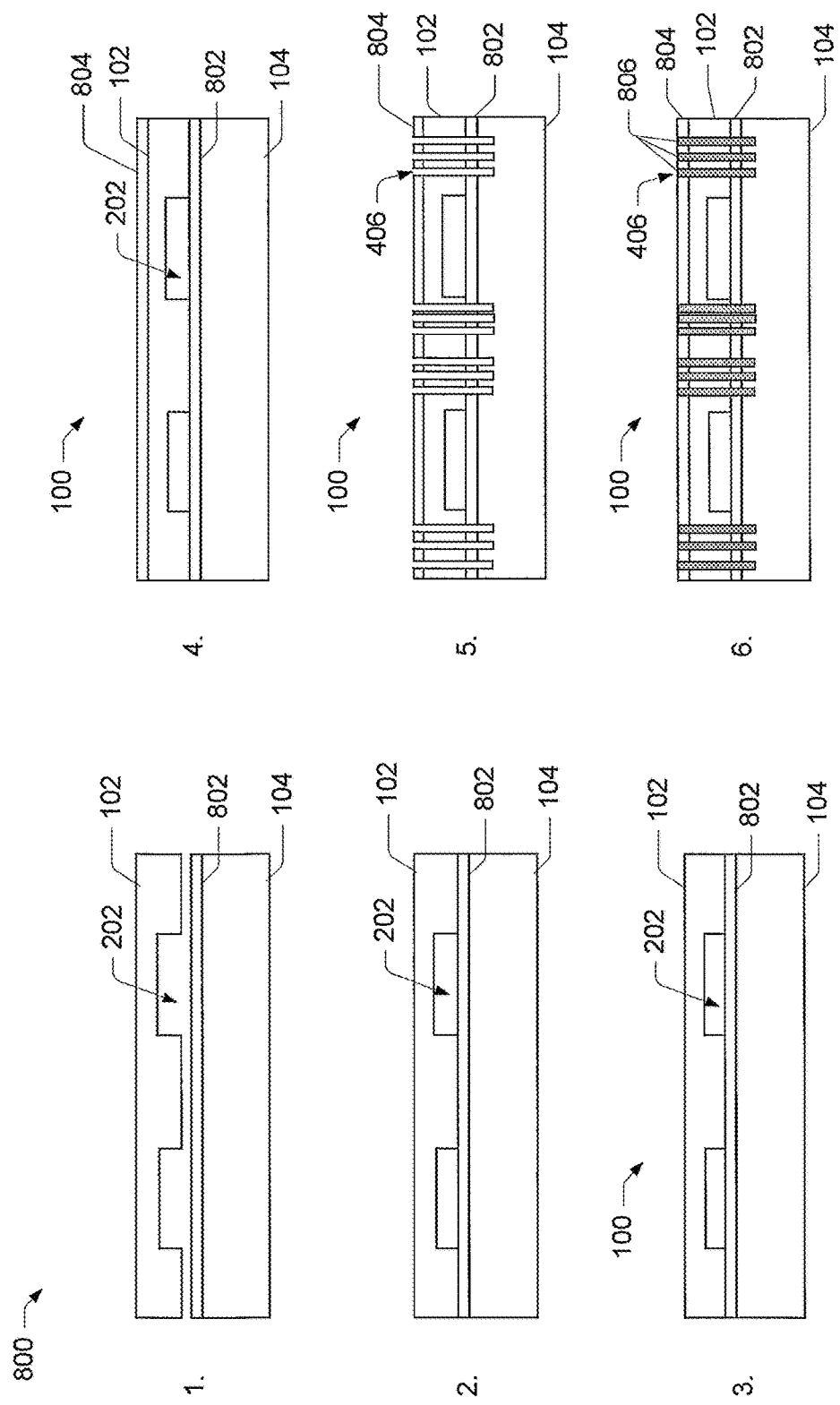
FIG. 8 is a graphical flow diagram illustrating an example processing sequence to form a sealed microelectronic device, according to another embodiment.

FIG. 8 is a graphical flow diagram illustrating an example processing sequence 800 to form a sealed microelectronic device 100, according to another embodiment using interior seals (e.g., 806). In various embodiments, the process 800 described with reference to FIG. 8 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed and prepared for bonding to a second wafer 104. In various embodiments, the bonding surface of the second wafer 104 may include an added layer 802, such as an insulating layer, a dielectric layer, a semiconductor layer, a metallic layer, and so forth.

At block 2, the cavity wafer 102 is bonded to the second wafer 104, closing the cavity 202 within. The cavity wafer 102 can be bonded to the second wafer 104 (and the layer 802) using an intimate surface bonding technique, for example, such as a ZIBOND® technique, wherein insulating surfaces (e.g., SiOx-SiOx, etc.) are bonded. In another example, the cavity wafer 102 can be bonded to the second wafer 104 using another dielectric bonding technique (e.g. die attach film or paste, a polymeric material such as a silicone or epoxy, or the like, which may not provide a hermetic seal and may not improve or fix a hermetic seal).

At block 3, the cavity wafer 102 and/or the second wafer 104 may be thinned based on the intended application. At block 4, a coating or layer 804, such as a dielectric layer or the like, may be applied to the exposed surface of the cavity wafer 102. At block 5, one or more channels 406 (or "cavity rings," partly or fully surrounding the cavities 202) can be formed through portions of the cavity wafer 102, portions of the second wafer 104, and through one or both of the layers 802 and 804. The channels 406 may be formed by etching, drilling, or otherwise removing material from the wafers 102 and 104, and may be open to an outside surface of the cavity wafer 102 or the second wafer 104.

At block 6, the cavity ring channels 406 can be partially or fully filled/plated with a metallic material (e.g., copper) to form filled seal rings 806. The filled seal rings 806 hermetically seal the bond joints between the cavity wafer 102 and the second wafer 104, sealing the cavities 202. In an implementation, the top exposed portion of the metallic seal rings 806 comprise a redistribution layer (RDL).

Figure 9A:
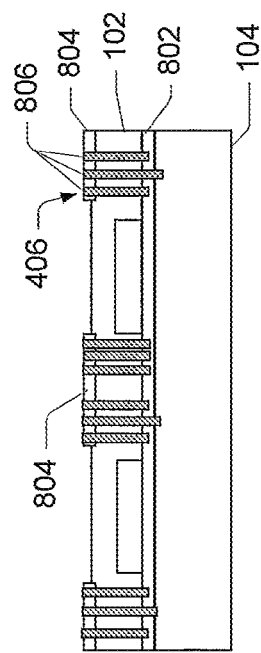
FIGS. 9A-9C illustrate example embodiments of sealed microelectronic devices, according to various embodiments.
Figure 9B:
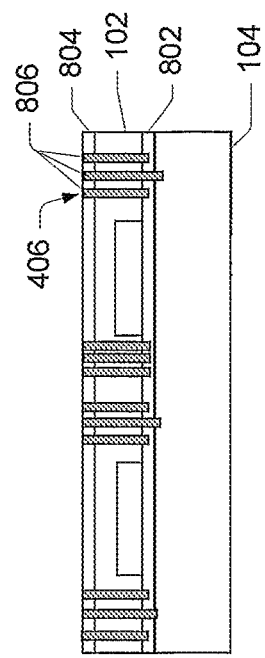
Figure 9C:
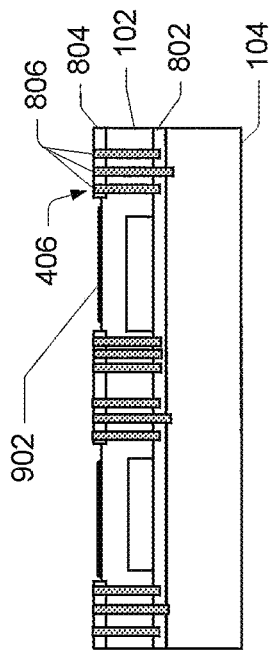

Referring to FIGS. 9A-9C, several embodiments of the sealed microelectronic device 100 are illustrated as examples. FIG. 9A shows a sealed microelectronic device 100 wherein the bottom portion of the one or more filled seal rings 806 is disposed within the layer 802 (which may be a dielectric layer, for example), and may or may not penetrate the second wafer 104. An opposite end of the filled seal rings 806 (e.g., at the top of the cavity wafer 102) may be exposed and contact a metal layer for electrical (and/or heat dissipation) function of the microelectronic device 100, for example.

FIG. 9B shows another sealed microelectronic device 100 wherein the bottom portion of the filled seal rings 806 is disposed within the layer 802 (which may be a dielectric layer, for example), and may or may not penetrate the second wafer 104. The top portion of the filled seal rings 806 forms a redistribution layer (RDL) over a portion of the exposed surface of the cavity wafer 102. In the embodiment, the dielectric layer 804 is patterned so that the dielectric layer 804 is not covering over the one or more cavities 202. FIG. 9C shows a further sealed microelectronic device 100 wherein the bottom portion of the filled seal rings 806 is disposed within the layer 802 (which may be a dielectric layer, for example), and may or may not penetrate the second wafer 104. The top portion of the filled seal rings 806 forms a redistribution layer (RDL) over one or more portions of the exposed surface of the cavity wafer 102. In the embodiment, the dielectric layer 804 is patterned so that the dielectric layer 804 is not covering over the one or more cavities 202, however, a different layer 902 is arranged to cover over the cavities 202. In various embodiments, the different layer 902 may comprise a substrate, a glass panel, a metallic layer, or the like.

FIG. 10 is a graphical flow diagram illustrating an example processing sequence 1000 to form a sealed microelectronic device 100, according to another embodiment using interior seals (e.g., 806). In various embodiments, the process 1000 described with reference to FIG. 10 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed and prepared for bonding to a second wafer 104. In various embodiments, the bonding surface of the second wafer 104 may include an added layer 802, such as an insulating layer, a dielectric layer, a semiconductor layer, a metallic layer, and so forth.

At block 2, the cavity wafer 102 is bonded to the second wafer 104, closing the cavity 202 within. The cavity wafer 102 can be bonded to the second wafer 104 (and the layer 802) using an intimate surface bonding technique, for example, such as a ZIBOND® technique, wherein insulating surfaces (e.g., SiOx-SiOx, etc.) are bonded. In another example, the cavity wafer 102 can be bonded to the second wafer 104 using another dielectric bonding technique (e.g. die attach film or paste, a polymeric material such as a silicone or epoxy, or the like, which may not provide a hermetic seal and may not improve or fix a hermetic seal).

At block 3, the cavity wafer 102 and/or the second wafer 104 may be thinned based on the intended application. Further, the assembly featuring the cavity wafer 102 and the second wafer 104 may be flipped for processing from the second wafer 104 side. At block 4, a coating or layer 804, such as a dielectric layer or the like, may be applied to the exposed surface of the second wafer 104. At block 5, one or more channels 406 (or "cavity rings," partly or fully surrounding the cavities 202) can be formed through portions of the second wafer 104, portions of the cavity wafer 102, and through one or both of the layers 802 and 804. The channels 406 may be formed by etching, drilling, or otherwise removing material from the wafers 102 and 104, and may be open to an outside surface of the second wafer 104 or the cavity wafer 102. As discussed above, the channels may extend only the interface between wafers (or dies) 102 and 104 and may extend to one or more metallic features such as a pad or via on or within wafer 104.

At block 6, the cavity ring channels 406 can be partially or fully filled/plated with a metallic material (e.g., copper) to form filled seal rings 806. The filled seal rings 806 hermetically seal the bond joints between the second wafer 104 and the cavity wafer 102, sealing the cavities 202. In an implementation, the top exposed portion of the metallic seal rings 806 may comprise a redistribution layer (RDL).

Figure 11B:
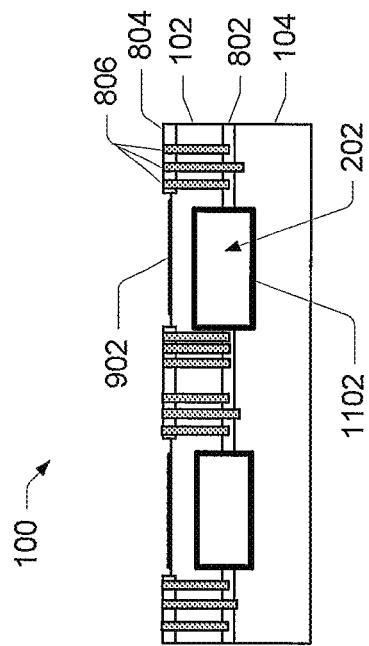
FIGS. 11A and 11B illustrate example embodiments of sealed microelectronic devices, according to various embodiments.
Figure 11A:
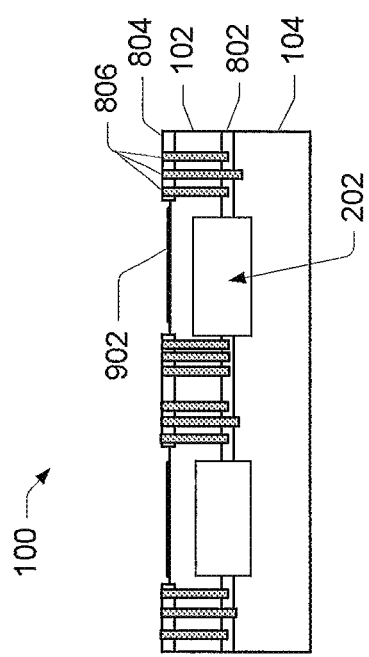

Referring to FIGS. 11A-11B, embodiments of the sealed microelectronic device 100 are illustrated as examples. FIGS. 11A and 11B show sealed microelectronic devices 100 wherein the bottom portion of the filled seal rings 806 is disposed within the layer 802 (which may be a dielectric layer, for example), and may or may not penetrate the cavity wafer 102. An opposite end of the filled seal rings 806 (e.g., at the top of the second wafer 104) may be exposed and contact a metal layer for electrical function of the microelectronic device 100, for example. In the embodiments, the dielectric layer 804 is patterned so that the dielectric layer 804 is not covering over the one or more cavities 202, however, a different layer 902 is arranged to cover over the cavities 202. In various embodiments, the different layer 902 may comprise a substrate, a glass panel, a metallic layer, or the like.

In various embodiments, as shown at FIGS. 11A and 11B, the one or more cavities 202 extend into the second wafer 104 as well as the cavity wafer 102. The filled seal rings 806 hermetically seal the bond joints between the second wafer 104 and the cavity wafer 102, sealing the cavities 202. Additionally, as shown in FIG. 11B, a metallic barrier layer 1102 may be applied within one or more of the cavities 202 to further seal the one or more cavities 202. The metallic barrier 1102 can be disposed on the side walls, or on the side, top, and bottom walls, partially or fully covering the inside surfaces of the cavities 202, as shown in FIG. 11B. In an implementation, the metallic barrier 1102 may be applied to the inside surfaces of the cavities 202 prior to bonding the cavity wafer 102 to the second wafer 104. The bonding process may include a metal-to-metal bonding (such as DBI, for instance), with or without a heated annealing, to bond the metallic barrier 1102 disposed on the inside surfaces of the cavity wafer 102 to the metallic barrier 1102 disposed on the inside surfaces of the second wafer 104, forming a continuous metallic sealing barrier 1102.

Figure 12:
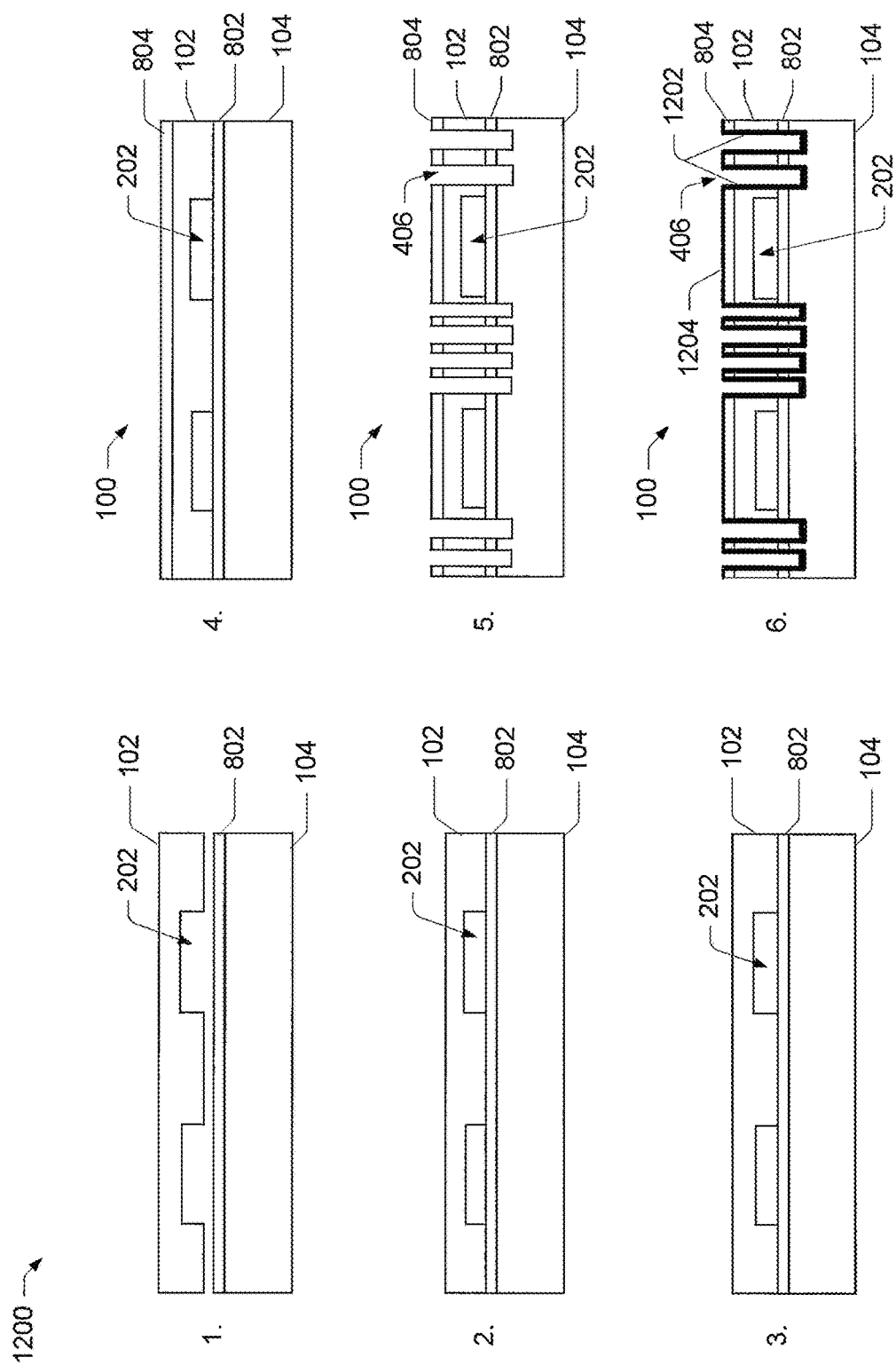
FIG. 12 is a graphical flow diagram illustrating an example processing sequence to form a sealed microelectronic device, according to an additional embodiment.

FIG. 12 is a graphical flow diagram illustrating an example processing sequence 1200 to form a sealed microelectronic device 100, according to another embodiment using interior seals (e.g., 1202). In various embodiments, the process 1200 described with reference to FIG. 12 may be used to modify other assembly processes (e.g., the process 200 referred to at FIG. 2, for example) that include bonding microelectronic components (e.g., 102, 104, 206, etc.), to include techniques and devices for hermetically sealing the bonded microelectronic components (e.g., 102, 104, 206, etc.) at the bond joints, as desired.

At block 1, a recessed cavity wafer 102 is formed and prepared for bonding to a second wafer 104 (which may or may not be a MEMS wafer, for example). In various embodiments, the bonding surface of the second wafer 104 may include an added layer 802, such as an insulating layer, a dielectric layer, a semiconductor layer, a metallic layer, and so forth.

At block 2, the cavity wafer 102 is bonded to the second wafer 104, closing the cavity 202 within. The cavity wafer 102 can be bonded to the second wafer 104 (and the layer 802) using an intimate surface bonding technique, for example, such as a ZIBOND® technique, wherein insulating surfaces (e.g., SiOx-SiOx, etc.) are bonded. In another example, the cavity wafer 102 can be bonded to the second wafer 104 using another dielectric bonding technique (e.g. die attach film or paste, a polymeric material such as a silicone or epoxy, or the like, which may not provide a hermetic seal and may not improve or fix a hermetic seal).

At block 3, the cavity wafer 102 and/or the second wafer 104 may be thinned based on the intended application. At block 4, a coating or layer 804, such as a dielectric layer or the like, may be applied to the exposed surface of the cavity wafer 102. At block 5, one or more channels 406 (or "cavity rings," partly or fully surrounding the cavities 202) can be formed through portions of the cavity wafer 102, portions of the second wafer 104, and through one or both of the layers 802 and 804. The channels 406 may be formed by etching, drilling, or otherwise removing material from the wafers 102 and 104, and may be open to an outside surface of the cavity wafer 102 or the second wafer 104.

At block 6, the cavity ring channels 406 can be partially filled/plated with a metallic material (e.g., copper) to form conformal seal rings 1202. The seal rings 1202 hermetically seal the bond joints between the cavity wafer 102 and the second wafer 104, sealing the cavities 202. In various embodiments, the channels 406 can be filled/plated to form the conformal seal rings 1202 while a metallic layer 1204 is deposited onto at least a portion of the exposed surface of the cavity wafer 102. Accordingly, in various embodiments, the channels 406 are filled in the same or in separate processes as the deposition of the metallic layer 1204.

Figures 13A, 13B, 13C:
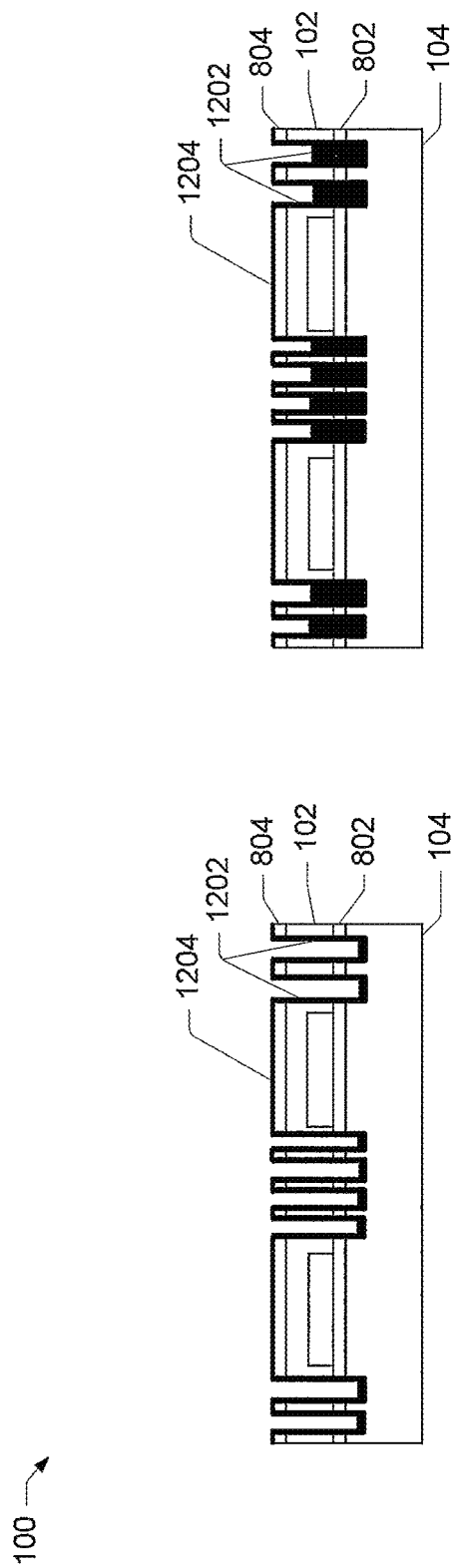
FIGS. 13A-13C illustrate example embodiments of sealed microelectronic devices, according to various embodiments.

Referring to FIGS. 13A-13C, several embodiments of the sealed microelectronic device 100 are illustrated as examples. FIGS. 13A-13C show sealed microelectronic devices 100 wherein the seal rings 1202 are formed through the cavity layer 102, and the bottom portion of the seal rings 1202 is disposed through the layer 802 (which may be a dielectric layer, for example) and also penetrate the second wafer 104. FIGS. 13A and 13B show partially filled seal rings 1202 (e.g., plated in a vacuum, for example), with the embodiment shown at FIG. 13B having a greater quantity of metal within the partially filled seal rings 1202 than the embodiment shown at FIG. 13A. Annealing the substrates (bonded wafers 102 and 104) in the partially filled condition at temperatures between 80 and 250 C can enlarge the grain size of the plated metal (e.g., 1202 and/or 1204). The process of producing the enlarged grain sizes can reduce impurities within the metal layer of the seal rings 1202 and/or the metallic layer 1204. In an implementation, the grains have a general (e.g., average) diameter that is greater than 10 percent of the width dimension of the channel 406.

FIG. 13C shows fully filled seal rings 1202 within the channels 406. In some embodiments, the annealed metal of the partially filled seal rings 1202, as shown in FIGS. 13A and 13B, can be added to or coated with an additional metal layer to form the fully filled seal rings 1202. In an embodiment, the sealed microelectronic device 100 may be annealed again after deposition of the additional metal layer. In some cases, CMP may be used prior to the final annealing or afterwards, to form a desired surface for the filled seal rings 1202. One or more additional materials may be provided in the unfilled portion of the seal ring 1202, as needed, for reliability, robustness, performance, etc.

The top (e.g., exposed) end of the filled seal rings 1202 (e.g., at the top surface of the cavity wafer 102) may be exposed and contact a metal layer for electrical function of the microelectronic device 100, for example, when bonded to another device.

The quantity of seal rings 302, 402, 404, 806, and 1202 shown in the illustrations of FIGS. 1-13 are for example and discussion. In various embodiments, a sealed microelectronic device 100 or like assembly may include fewer, or a greater quantity of seal rings 302, 402, 404, 806, and 1202, and remain within the scope of the disclosure. Moreover, various implementations described herein may be combined to further enhance the improvement over conventional techniques of fabricating a MEMS device. For example, while seal rings are shown to extend into one surface from one side of the component, seal rings may be formed from both sides and may contact each other to form a metallic structure fully extending through the sealed microelectronic device 100.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A method of forming a microelectronic assembly, the method comprising:
    bonding a first bonding surface of a first microelectronic component to a second bonding surface of a second microelectronic component along a bond joint by directly bonding a first insulating surface of the first bonding surface to a second insulating surface of the second bonding surface without an adhesive to form a covalent bond between the first and second insulating surfaces, a cavity disposed between the first and second microelectronic components;
    after the bonding, forming a channel from an outside surface of the first microelectronic component to at least the bond joint, the outside surface opposite the first bonding surface; and
    forming a seal in the channel that extends from the outside surface to at least the bond joint.

2. The method of claim 1, wherein forming the channel comprises forming the channel to cross the bond joint, the seal crossing the bond joint.

3. The method of claim 1, wherein forming the channel comprises forming the channel to fully surround the cavity.

4. The method of claim 1, wherein one of the first and second microelectronic components comprises a die and the cavity is formed within the die, and the other of the first and second microelectronic components comprises a microelectromechanical systems (MEMS) die.

5. The method of claim 1, further comprising, after the bonding, mounting the second microelectronic component to a third microelectronic component.

6. The method of claim 5, wherein the second microelectronic component comprises a microelectromechanical systems (MEMS) die and the third microelectronic component comprises a logic die, the MEMS die mounted to the logic die.

7. The method of claim 1, wherein forming the channel comprises exposing a metallic feature on or in the second microelectronic component, and wherein forming the seal comprises contacting the seal with the metallic feature on or in the second microelectronic component.

8. The method of claim 1, wherein the seal comprises an interior seal, the method further comprising:
    providing an exterior seal that surrounds the bond joint and the second microelectronic component.

9. A microelectronic assembly comprising:
    a first microelectronic component having a first insulating bonding surface;
    a second microelectronic component having a second insulating bonding surface, the first and second bonding surfaces directly bonded together along a bond joint by way of a low temperature covalent bond;
    a cavity between the first and second microelectronic components;
    a channel extending from an outside surface of the first microelectronic component to at least the bond joint, the outside surface opposite the first bonding surface; and
    a seal disposed in the channel and that extends from the outside surface to at least the bond joint.

10. The microelectronic assembly of claim 9, wherein the channel and the seal cross the bond joint.

11. The microelectronic assembly of claim 9, wherein the channel fully surrounds the cavity.

12. The microelectronic assembly of claim 9, wherein one of the first and second microelectronic components comprises a die and the cavity is formed within the die, and the other of the first and second microelectronic components comprises a microelectromechanical systems (MEMS) die.

13. The microelectronic assembly of claim 12, further comprising a logic die, the MEMS die mounted to the logic die.

14. The microelectronic assembly of claim 9, wherein the channel extends from the outside surface of the first microelectronic component to a conductor in the second microelectronic component.

15. The microelectronic assembly of claim 14, wherein the seal contacts the conductor in the second microelectronic component.

16. The microelectronic assembly of claim 14 wherein the conductor is partially or fully embedded within the second microelectronic component.

17. The microelectronic assembly of claim 16 wherein the conductor is disposed at or near the bond joint.

18. The microelectronic assembly of claim 16 wherein the conductor fully surrounds the cavity.

19. The microelectronic assembly of claim 9, wherein the seal comprises a metal.

20. The microelectronic assembly of claim 19, wherein the metal fills the channel.

* * * * *